United States Patent
Lochtefeld

(10) Patent No.: US 9,812,601 B2
(45) Date of Patent: Nov. 7, 2017

(54) SOLAR CELLL

(71) Applicant: Anthony Lochtefeld, Ipswich, MA (US)

(72) Inventor: Anthony Lochtefeld, Ipswich, MA (US)

(73) Assignee: Amberwave Inc., Salem, NH (US)

( * ) Notice: Subject to any disclaimer, the term of this patent is extended or adjusted under 35 U.S.C. 154(b) by 502 days.

(21) Appl. No.: 14/217,045

(22) Filed: Mar. 17, 2014

(65) Prior Publication Data

US 2014/0261652 A1  Sep. 18, 2014

Related U.S. Application Data

(60) Provisional application No. 61/799,148, filed on Mar. 15, 2013.

(51) Int. Cl.
  *H01L 21/00* (2006.01)
  *H01L 31/0687* (2012.01)
  *H01L 31/18* (2006.01)

(52) U.S. Cl.
  CPC ...... *H01L 31/0687* (2013.01); *H01L 31/1852* (2013.01); *Y02E 10/544* (2013.01); *Y02P 70/521* (2015.11)

(58) Field of Classification Search
  CPC .................. H01L 31/0687; H01L 31/1852
  USPC ....................................................... 438/57, 63
  See application file for complete search history.

(56) References Cited

U.S. PATENT DOCUMENTS

| | | | |
|---|---|---|---|
| 2010/0139764 A1* | 6/2010 | Smith | H01L 31/182 136/256 |
| 2011/0143495 A1* | 6/2011 | Pitera | H01L 31/0687 438/94 |
| 2013/0276860 A1* | 10/2013 | Karakida | H01L 31/068 136/244 |

OTHER PUBLICATIONS

"Wet-Chemical Etching and Cleaning of Silicon", Jan. 2003, Virginia Semiconductor Inc.*

* cited by examiner

*Primary Examiner* — Kimberly Rizkallah
*Assistant Examiner* — Maria Ligai

(57) ABSTRACT

A device, system, and method for a multi junction solar cell are described herein. An exemplary multi-solar cell structure can have a substrate having a first surface having a (111) crystalline etched surface. A dielectric layer can be deposited on the first surface of the substrate. A graded buffer layer can be grown on a second surface of the substrate with the second surface having a (100) crystalline surface. A first solar subcell within or on top of the graded buffer layer and a second solar subcell grown on top of the first solar subcell.

11 Claims, 12 Drawing Sheets

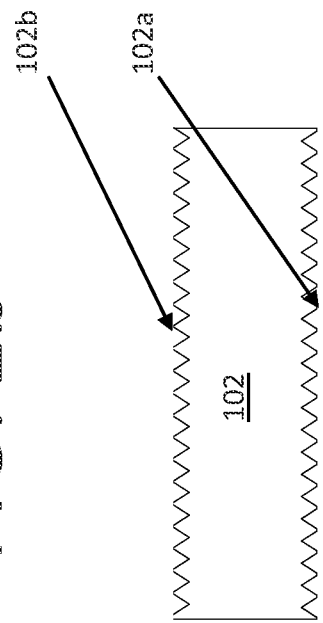
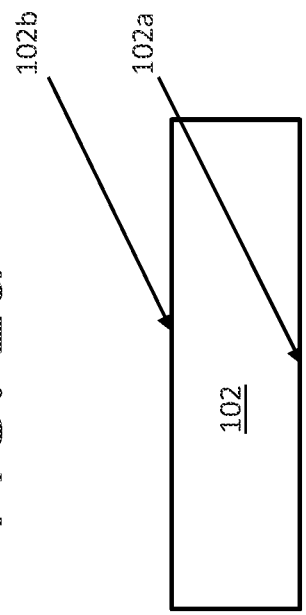

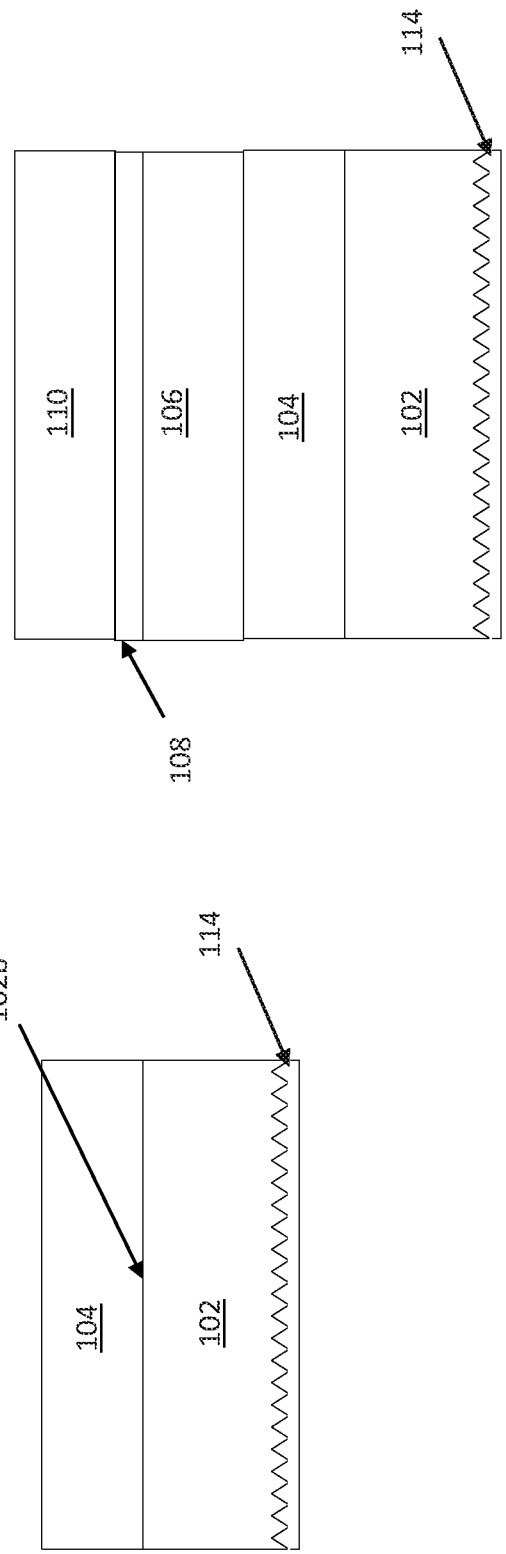

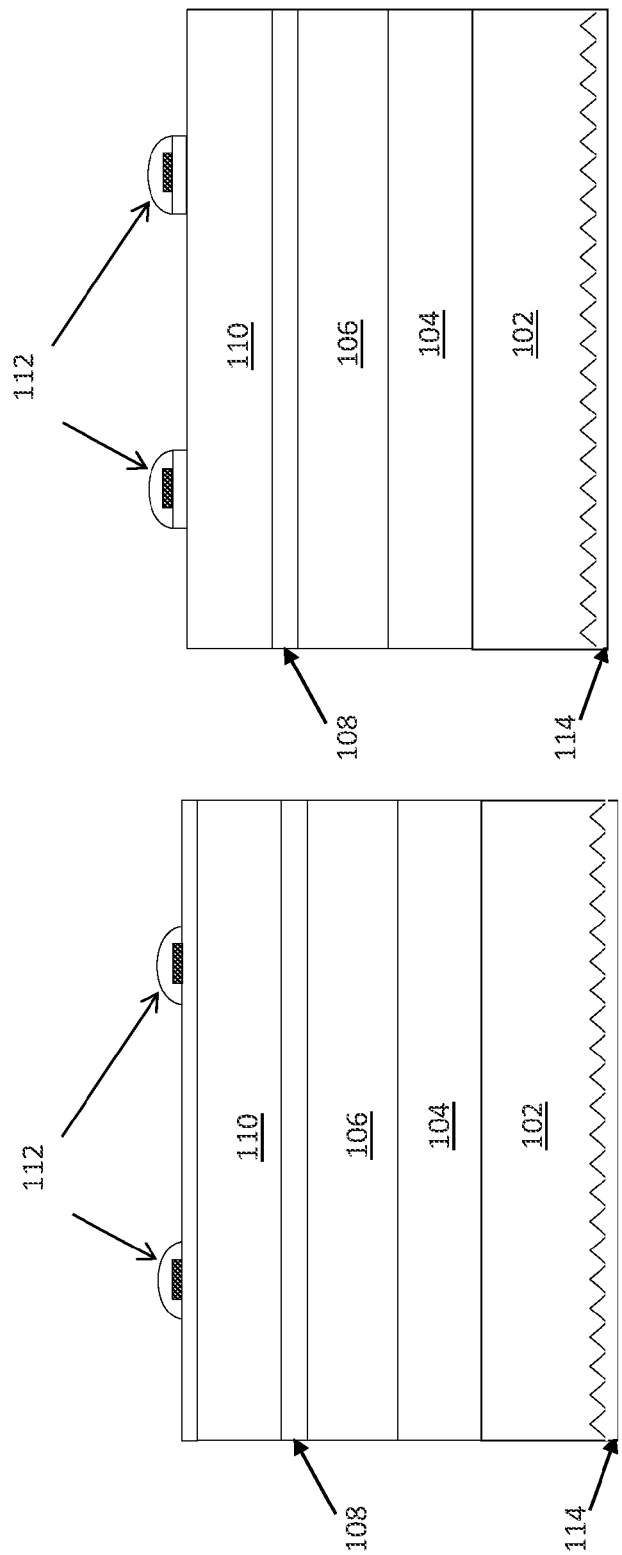

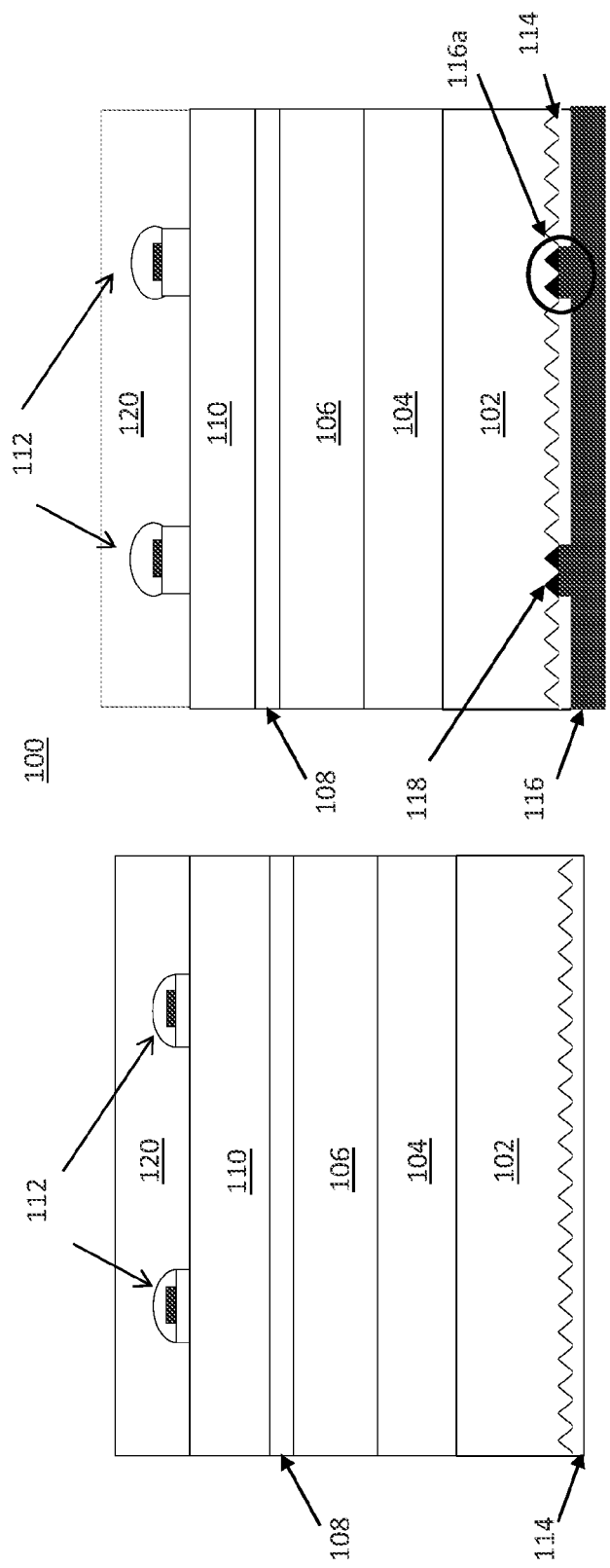

300

Fig. 4   Example Solar Cell Epilayer details

| Layer | Description | Example thickness | Doping Type | Example Doping Level (cm-3) | Composition Example | Notes |
|---|---|---|---|---|---|---|
| 13 | III-V contact layer | 20-500nm | N | 1e18-1e20 | GaAsP | Or could be GaAs. Only under contacts in final structure; removed elsewhere via wet etch. |
| 12 | III-V window layer | 10-50nm | N | 1e17-1e19 | AlInP | ~LM to nucleation layer or tensile. Could be InGaP or InGaAsP instead of AlInP |
| 11 | III-V emitter layer | 50-200nm | N | 1e17-1e19 | GaAsP | ~LM to nucleation layer. |
| 10 | III-V base layer | 0.2-1.5 um | P | 1e16-1e18 | GaAsP | ~LM to nucleation layer. |
| 9 | III-V BSF | 50-200nm | P | 1e17-1e19 | InGaP | ~LM to nucleation layer. |
| 8 | III-V TJ, P-side | 10-40nm | P | 1e19-1e20 | GaAsP, e.g. | Could be InGaP. ~LM to nucleation layer. |
| 7 | III-V TJ, N-side | 10-40nm | N | 1e19-1e20 | GaAsP, e.g. | Could be InGaP. ~LM to nucleation layer. |
| 6 | III-V Nucleation layer | 10-200nm | N | 1e18-1e19 | InGaP, e.g | ~LM to SiGe base, within +/- 0.5% |
| 5 | Ge cap layer | 5-15nm | N | 1e18-1e20 | ~100% Ge | Thin enough to not be substantially relaxed. This layer may not be required |
| 4 | SiGe emitter layer | 50-200nm | N | 1e18-1e20 | Ge% = to base | ~LM to SiGe base. |
| 3b | SiGe base layer | 0.5-2.0um | P | 1e15-1e17 | Ge = e.g. 80% | SiGe base could be anywhere from 50-90%, approximately matched to the terminal Ge composition of graded buffer |
| 3a | SiGe BSF | 50-500nm | P+ | 1e17-1e19 | Ge = e.g. 80% | SiGe base could be anywhere from 50-90%, approximately matched to the terminal Ge composition of graded buffer |
| 2 | SiGe GB | 1.0-5.0um | P | 1e15-1e18 | SiGe, Ge= 0→80%, e.g. | Final Ge comp could be anywhere from at least 50-90% |
| 1 | Si substrate | 100-1000um | P | 1e15-3e17 | Silicon | (100) Surface offcut 2.8° toward <110> or <111>. Could be metallurgical grade monocrystalline. |

Top cell: layers 13–9; TJ: layers 8–7; Bottom cell: layers 6–1.

Fig. 5
Alternative Option #1
Replacing layers 5-8 in Fig. 4 with the following layers, to put tunnel junction in Ge

| Description | Example thickness | Doping Type | Example Doping Level (cm-3) | Composition Example | Notes |
|---|---|---|---|---|---|
| Nucleation layer | 10-100nm | P | 1e18-1e19 | InGaP, e.g | ~LM to SiGe base, within +/- 0.5% |
| Ge TJ, P side | 5-10nm | P | 1e18-1e20 | ~100% Ge | Doping in-situ during epi growth. Combined thickness of both Ge TJ layers is thin enough to not be substantially relaxed, e.g. no more than twice the equilibrium critical thickness |
| Ge TJ, N side | 5-10nm | N | 1e18-1e20 | ~100% Ge | Doped in-situ during epi growth |

*Additional layers not shown here may be included in optimized solar cell*

"~" means "approximately"

Fig. 6

Alternative Option #2
Replacing layers 5-8 in Fig. 4 with the following layers, to put tunnel junction in SiGe

| Description | Example thickness | Doping Type | Example Doping Level (cm-3) | Composition Example | Notes |
|---|---|---|---|---|---|
| Nucleation layer | 10-100nm | P | 1e18-1e19 | InGaP, e.g | ~LM to SiGe base, within +/- 0.5% |
| Ge cap layer | 5-15nm | P | 1e18-1e20 | ~100% Ge | Thin enough to not be substantially relaxed, e.g. no more than twice the equilibrium critical thickness |
| SiGe TJ, P side | 5-20nm | P | 1e18-1e20 | Ge = e.g. 80-90% | Doping in-situ during epi growth. Ge% could be approximately matched to the terminal Ge composition of graded buffer, or slightly more Ge-rich (up to 10%) for narrower bandgap to make tunnel junction easier to form. |
| SiGe TJ, N side | 5-20nm | N | 1e18-1e20 | Ge = e.g. 80-90% | Doping in-situ during epi growth. Ge% could be approximately matched to the terminal Ge composition of graded buffer, or slightly more Ge-rich (up to 10%) for narrower bandgap to make tunnel junction easier to form. |

"~" means "approximately"

*Additional layers not shown here may be included in optimized solar cell*

Fig. 7

Alternative Option #3
Replacing layers 6-8 in Fig. 4, with a hetero-tunnel-junction

| Description | Example thickness | Doping Type | Example Doping Level (cm-3) | Composition Example | Notes |
|---|---|---|---|---|---|
| III-V Nucleation layer AND P-side of tunnel junction | 10-100nm | N | 1e19-1e20 | InGaP | ~LM to SiGe base, within +/- 0.5% |

N-type Ge layer (layer 5 in slide 11) serves as N-side of TJ

*Additional layers not shown here may be included in optimized solar cell*

"~" means "approximately"

Fig. 8

Alternative Option #4

- Putting a III-V graded buffer between the top and bottom solar cell, to allow for lower top cell Eg, which may lead to moderately higher efficiency
- III-V epi layers only are shown below. Layers 1-5 can be as on Fig. 4.
- Changes versus Fig. 4 are in underline.

| Layer | Description | Example thickness | Doping Type | Example Doping Level (cm-3) | Composition Example | Notes |
|---|---|---|---|---|---|---|
| 14 | III-V contact layer | 20-500nm | N | 1e18-1e20 | GaAsP | Or could be GaAs. Only under contacts in final structure; removed elsewhere via wet etch. |
| 13 | III-V window layer | 10-50nm | N | 1e17-1e19 | AlInP | ~LM to BSF |
| 12 | III-V emitter layer | 50-200nm | N | 1e17-1e19 | GaAsP | ~LM to BSF |
| 11 | III-V base layer | 0.2-1.5 um | P | 1e16-1e18 | GaAsP | ~LM to BSF |
| 10 | III-V BSF | 50-200nm | P | 1e17-1e19 | InGaP | ~LM to III-V graded buffer terminal layer |
| 9 | III-V graded buffer | 0.5-1.5 um | P | 1e17-1e19 | $GaAs_{1-x}P_x$ x = ~0.2 (bottom) to ~0.1 (top) for example | Bottom is LM to nucleation layer. Top has lattice constant up to approx 0.5% larger |
| 8 | III-V TJ, P-side | 10-40nm | P | 1e19-1e20 | GaAsP, e.g. | Could be InGaP. ~LM to nucleation layer. |
| 7 | III-V TJ, N-side | 10-40nm | N | 1e19-1e20 | GaAsP, e.g. | Could be InGaP. ~LM to nucleation layer. |
| 6 | III-V Nucleation layer | 10-200nm | N | 1e18-1e19 | InGaP, e.g. | ~LM to SiGe base, within +/- 0.5% |

Note: any of options 1, 2, or 3 may be combined with Option 4

SOLAR CELLL

RELATED APPLICATIONS

This application claims the benefit of and priority to U.S. Provisional Application Ser. No. 61/799,148 filed Mar. 15, 2013, the disclosures of which are hereby incorporated by reference in their entirety.

TECHNICAL FIELD

The present invention relates to solar cells and more particularly, relates to a solar cell utilizing a graded buffer and layers within a solar cell.

BACKGROUND

There is considerable interest in the design and fabrication of tandem multi junction solar cells for high efficiency photovoltaics for space-based and terrestrial applications. Multi junction solar cells comprise two or more p-n junction subcells with band gaps engineered to enable efficient collection of the broad solar spectrum. The subcell band gaps are controlled such that as the incident solar spectrum passes down through the multi junction solar cell it passes through subcells of sequentially decreasing band gap energy. Thus, the efficiency losses associated with single junction cells—inefficient collection of high-energy photons and failure to collect low-energy photons—are minimized.

SUMMARY

A device, system, and method for a multi junction solar cell are described herein. An exemplary multi-solar cell structure can have a substrate having a first surface having a (111) crystalline etched surface. A dielectric layer can be deposited on the first surface of the substrate. A graded buffer layer can be grown on a second surface of the substrate with the second surface having a (100) crystalline surface. A first solar subcell within or on top of the graded buffer layer and a second solar subcell grown on top of the first solar subcell.

Exemplary embodiments may include one or more of the following: The first surface of the silicon substrate can have a potassium hydroxide etched surface. The second surface can have characteristics provided by etching to a (111) crystalline surface and then etching to a (100) crystalline surface. The dielectric layer can be silicon dioxide with a thickness of about 10-1000 nanometers. The multi junction solar cell can also have openings through the dielectric layer on over about 0.5-10 percent of a surface area of the dielectric layer and a metal on a rear surface of the dielectric layer and within the openings wherein the metal provides a bottom electrical contact and a reflective layer.

Another exemplary embodiment can involve a method of monocrystalline solar cell construction. The method may involve providing a silicon substrate, etching a first surface of the silicon substrate, depositing a dielectric layer on the first surface of the silicon substrate, and etching a second surface of the silicon substrate. A silicon germanium graded buffer layer can be deposited on the second surface of the substrate. A first solar subcell base layer and a first solar subcell emitter layer can be deposited within or on top of the graded buffer layer. A second solar subcell base layer and a second solar subcell emitter layer of GaAsP or other III-V material can be deposited on top of the first solar subcell base layer and the first solar subcell emitter layer.

Exemplary embodiments may include one or more of the following: The action of etching a first surface of the silicon substrate can comprise etching the second surface of the silicon substrate with the same etchant in the same etching process. The action of etching a first surface of the silicon substrate can use potassium hydroxide as an etchant. The silicon substrate can be a wafer sawn from a silicon ingot and said wafer has significant saw damage and said method of making a multi junction solar cell does not include lapping or polishing said wafer. A etched textured surface of the first surface can be provided by the action of etching the first surface is maintained through the dielectric layer. The action of etching a first surface of the silicon substrate can selectively stops at a silicon (111) crystalline surface. The action of etching a first surface of the silicon substrate can further comprise etching a second surface of the silicon and selectively stops at a silicon (111) crystalline surface on both the first surface and the second surface. The action of etching a second surface of the silicon substrate can remove a (111) crystalline surface and selectively stops at a (100) crystalline surface. The dielectric layer can mask the first surface during the action of etching a second surface of the silicon substrate.

The present invention is not intended to be limited to a system or method that must satisfy one or more of any stated objects or features of the invention. It is also important to note that the present invention is not limited to the exemplary or primary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings wherein:

FIG. 4 is a flow chart of more detailed exemplary actions used to construct a device in accordance with the exemplary multi junction cell embodiment of the invention.

FIGS. 5-8 are charts of more detailed alternative exemplary structure and actions used to construct a device in accordance with the exemplary multi junction cell embodiment of the invention.

DETAILED DESCRIPTION OF THE PREFERRED EMBODIMENTS

General

Solar modules using 16% efficient solar cells dominate the present PV market, but even at today's very low price below $1 a watt, they may not be profitably installed without significant subsidies, in most parts of the world. This is because the non-module cost (BOS, or Balance of Systems costs) dominates total installation cost. Most of these BOS costs are area dependent, and scale linearly with area. Therefore, higher efficiency solar cells reduce BOS costs, by reducing the amount of solar installation area for a given power output. It is estimated that for residential based rooftop installations, a doubling of efficiency can lead to about a 30% decrease in total installation cost per watt.

Embodiments of the invention can provide a tandem cell on silicon with the potential for at least 33% cell efficiency, or about double that of today's market-dominating silicon-based solar cells. This is shown in the form in FIG. 1. This makes uses of the SiGe graded buffer to allow the growth of low-dislocation density SiGe with Ge content for example of about 80%, on a silicon wafer. The top III-V cell can be GaAsP lattice matched to the SiGe below it. The GaAsP can have a bandgap of about 1.6 eV, and the SiGe a bandgap of about 0.9 eV.

Embodiments offer additional benefits for high efficiency multi junction solar cells based on III-V epitaxial subcells grown on silicon germanium subcells grown on graded buffers of silicon germanium on silicon substrates. Currently, the monocrystalline germanium substrate used for almost all commercial multi junction III-V solar cells accounts for the majority of the cost of such solar cells, even though only the top portion of this substrate contributes to solar cell operation. Embodiments may provide higher efficiencies, allowing Balance of Systems savings.

Solar Cell

Figure 1:
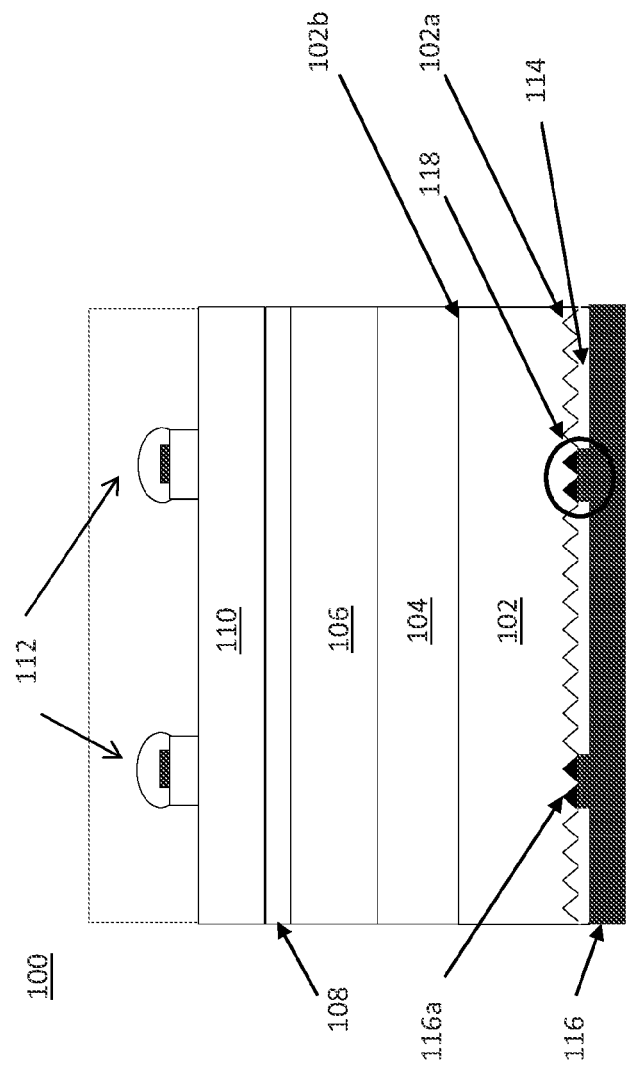
FIG. 1 is a profile diagram of a completed device in accordance with the exemplary multi-junction cell embodiment of the invention.

Referring to FIG. 1, the multi junction cell 100 may have the exemplary basic structure. A monocrystalline silicon substrate 102 may be used to construct a first portion of a solar cell 100. The silicon substrate includes a first surface 102a and second surface 102b. A dielectric layer 114 can be provided on the first surface 102a of the silicon substrate 102. A graded buffer layer 104 can be hetero-epitaxially grown on the second surface 102b of the substrate 102. A SiGe subcell 106 can be grown on the graded buffer layer 104. A GaAsP subcell 110 can be grown on the SiGe subcell 106. A tunnel junction 108 can be provided between the GaAsP subcell 110 and the SiGe subcell 106. Transition layers can be provided between the tunnel junction 108 and the GaAsP subcell 110. Top contacts 112 can be provided on the exposed surface of the GaAsP subcell 110. Bottom contact and/or reflective surface 116 can be provided on the bottom surface of the dielectric layer 114 and connected to the SiGe subcell though openings in the dielectric layer 114. Although exemplary embodiments describe a SiGe subcell, embodiments are not limited to SiGe and can include a solar subcell constructed of other materials suitable for providing a graded buffer. Additionally, embodiments are not limited to a top GaAsP subcell and can include a solar subcell constructed of other material suitable for growth over the bottom subcell.

Exemplary Solar Cell Production

Referring to FIGS. 2(a-k), an exemplary solar cell device is constructed in accordance with an exemplary multi junction embodiment of the invention. The starting substrate 102 wafer may be monocrystalline silicon wafer with p-type doping. The wafer can be p-type or n-type. In the example embodiment described herein, the wafer is p-type, with boron doping between $1e^{15}$ and $3e^{17}$ cm$^{-2}$. Doping higher than this latter number may reduce the transparency of the substrate, which may be important as will be understood subsequently herein. The starting substrate 102 may come from an ingot produced by the known Czochralski process, or by variations such as "continuous Czochralski" providing lower cost. It may also come from a seeded cast ingot, sometimes called "monocast." The wafer may be cut from the ingot via wire-sawing (either slurry or diamond wire saws) or other methods such as ion implant induced exfoliation. The wafer may have a surface finish typical of starting material used for silicon photovoltaic manufacture—i.e. it may have significant saw damage, unlike semiconductor wafers for most other applications, which have been lapped and/or polished. This may provide advantages, for example, minimizing manufacturing costs and time.

The substrate 102 wafer may have a thickness of about 100-1000 microns; for example, the thickness may be between 120 and 400 microns. The substrate 102 can be metallurgical grade monocrystalline silicon. The diameter of the substrate 102 wafer may be, but is not limited to, standard wafer sizes of about 100-300 mm. Alternately, substrate 102 wafer may be square or semi-square with a size of e.g. 125 mm or 156 mm across, typical sizes for Si solar cells.

Referring to FIG. 2b, a wet chemical etch of one or both first surface 102a and second surface 102b of the substrate 102 wafer, with an etch chemistry that selectively stops on (111) crystalline surface. This can be used to remove saw damage, and leave both surfaces textured with random pyramids with (111) faces, typically several microns in height. A typical etchant used for this purpose is KOH (potassium hydroxide) or TMAH. This process is known in the industry.

Figure 2D:
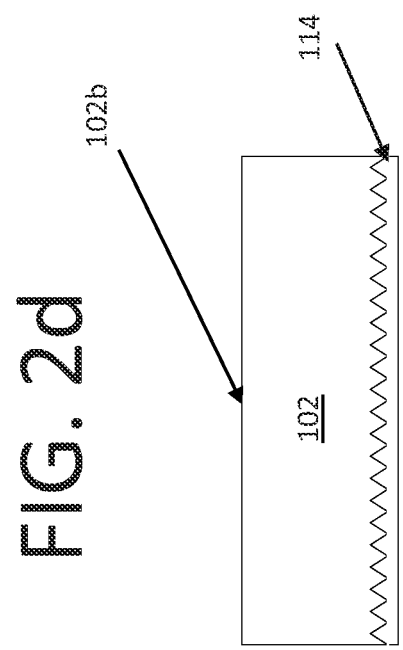
FIGS. 2(*a-k*) are profile diagrams of a device being constructed in accordance with an exemplary multi junction cell embodiment of the invention.
Figure 2C:
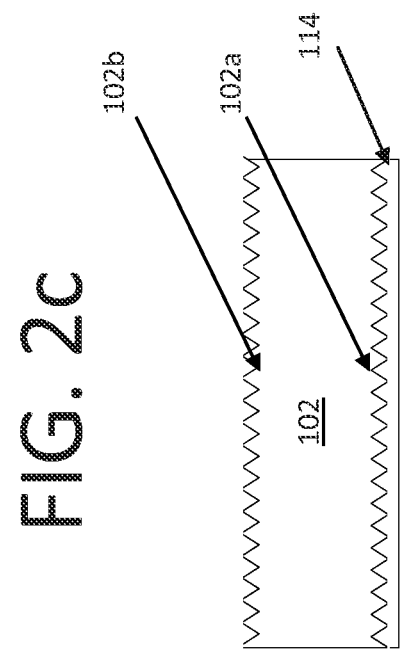

Referring to FIG. 2c, a dielectric layer 114 is deposited on the first surface 102a of the substrate 102. The thin (e.g. 10-1000 nm, or for example about 100 nm) dielectric layer 114 of e.g. SiN$_x$ or SiO$_2$ can be deposited on the bottom of substrate 102. Thickness can be e.g. 10-1000 nm. Deposition method can be PECVD for example. Methods to do this well known in the PV industry. The prior etching of the first surface 102a provides a textured surface of generally random pyramids structures on the surface as illustrated by the zigzag lines on the first surface 102a and second surface 102b. The deposited dielectric layer 114 can conform to the textured surface. For simplicity, this textured rear surface of the dielectric layer 114 is not indicated with a zigzag line in FIG. 2c or in subsequent Figures.

Referring to FIG. 2d, A second wet chemical etch can be used to attack Si (111) crystalline surfaces of the second surface 102b but stops selectively on Si (100) surfaces, and prevented from etching the first surface 102a by the dielectric layer 114 masking the rear of the wafer. This second etch can substantially remove the (111) texture on the first surface 102a of the substrate 102. The etched surface on the Si (100) surface is now illustrated by a smooth line for the second surface 102b. An approach to do this is described in greater detail in "Acid-Based Etching of Silicon Wafers: Mass-Transfer and Kinetic Effects", by Milind S. Kulkarni and Henry F. Erk, Journal of The Electrochemical Society, 147 (1) 176-188 (2000).

Referring to FIG. 2e, the graded buffer layer 104 can be hetero-epitaxially grown on the substrate 102. A CVD reactor such as an ASM Epsilon 2000 can be used to produce the relaxed graded buffer layer on substrate 102; alternately, a batch epitaxy reactor can be used. The various doping levels described in the graded buffer structure and SiGe subcell layers can be incorporated in-situ during epitaxial growth, by means well known in the art. The composition of the graded buffer layer 104 can be initiated with a 0% or relatively low germanium composition. A germanium content, x, of the Si$_{1-x}$Ge$_x$ layer is controlled by the relative concentration of the silicon and germanium precursors. By increasing the germanium content gradually, the strain due to lattice mismatch between silicon and germanium is gradually relieved, thereby minimizing threading dislocation density in the deposited relaxed SiGe layer. Typically, the germanium content of the graded $Si_{1-x}Ge_x$ layer is increased at a rate of about 10%-25% germanium per micron; however, embodiments need not be limited to that range. A final graded $Si_{1-x}Ge_x$ layer can comprise a 50-90% germanium composition, or for example 70-85% germanium composition. However, embodiments are not limited to that composition and various grading layers may be incorporated or may form a portion of the SiGe subcell 106. An exemplary process of growing the graded buffer layer 104 is described in greater detail and incorporated herein in U.S. Pat. No. 5,221,413 of Jun. 22, 1993 entitled: "Method for making low defect density semiconductor heterostructure and devices made thereby" and U.S. Pat. No. 7,041,170 of May 9, 2006 entitled: "Method of Producing High Quality Relaxed Silicon Germanium Layers". Graded buffer layer 104 may be doped n-type, with for example arsenic or phosphorous, for example in the range $1 \times 10^{16}$ cm$^{-3}$ to $1 \times 10^{19}$ cm$^{-3}$.

Referring to FIG. 2f, the SiGe subcell 106 can include a back surface field layer interfacing graded buffer layer 104, with Ge composition anywhere between 50-90%, approximately matched to the terminal germanium composition of graded buffer layer 104. The back surface field layer can have a thickness of e.g. 50-500 nm with n type doping levels of about $1e^{17}$-$1e^{19}$ cm$^{-3}$, or for example $3e^{17}$-$3e^{18}$ cm$^{-3}$. In an alternative embodiment, the back surface field layer may be tensile, with a germanium content lower than that of the terminal composition of graded buffer layer 104, for example about 25% lower Ge; in this case, the thickness of the back surface field layer may be thinner, for example about 20-100 nm. Due to the energy band offsets introduced by tension, a tensile back surface field layer may be more effective than a lattice-matched one. SiGe subcell 106 can include a base layer, with a Ge composition anywhere between 50-90%, approximately matched to the terminal germanium composition of graded buffer layer 104. The base layer can have a thickness of between 0.5-5.0 um with n type doping levels of about $1e^{15}$-$5e^{17}$ cm$^{-3}$, or for example levels of about $5e^{15}$-$5e^{16}$ cm$^{-3}$. If the back surface field layer is included, it can be below and in contact with the base layer.

An emitter layer can be grown on top of the base layer having a similar germanium composition or matched to the surface of the base layer. The emitter layer can have a p type doping level of $5e^{17}$-$5e^{19}$ cm$^{-3}$, or for example levels of about $1e^{18}$-$5e^{18}$ cm$^{-3}$.

The emitter layer can have a thickness of about 100-2000 nm, or for example about 200-500 nm. An exemplary process of growing a SiGe solar cell is described in greater detail and incorporated herein in U.S. patent application publication 2011/0120538 published May 26, 2011 entitled: "Silicon Germanium Solar Cell".

The tunnel junction 108 can be provided between the SiGe subcell 106 and GaAsP subcell 110. The tunnel junction 108 can comprise a bottom tunnel junction portion comprised of SiGe interfacing SiGe subcell 106, with p-type doping levels of about $7e^{18}$-$1e^{20}$ cm$^{-3}$ with a thickness of 5-20 nm. The percent of germanium can be approximately matched to the terminal germanium composition of graded buffer 104, or it can be richer in germanium (e.g. up to about 20% higher in Ge content, and may be pure Ge) for narrower bandgap to promote more effective tunneling behavior. A top SiGe tunnel junction portion can be provided having n type doping levels of about $7e^{18}$-$1e^{20}$ cm$^{-3}$ with a thickness of 5-20 nm. Again, the percent of germanium can be approximately matched to the terminal germanium composition of graded buffer 104, or it can be richer in germanium (e.g. up to about 20% higher in Ge content, and may be pure Ge) for narrower bandgap to promote more effective tunneling behavior. The tunneling interface is between the p-type bottom tunnel junction portion and the n-type top tunnel junction portion.

Transition layers (not shown) can be provided between the tunnel junction layers 108 and the GaAsP subcell 110. The transition layers may include a bottom transition layer interfacing tunnel junction 108 and comprising for example pure germanium, having n type doping levels of about $1e^{18}$-$1e^{20}$ cm$^{-3}$, or for example levels of about $5e^{18}$-$5e^{19}$ cm$^{-3}$, with a thickness of 5-30 nm. The transition layers may also include a top transition layer interfacing GaAsP subcell 110 comprised of a III-V semiconductor approximately lattice matched to the terminal portion of graded buffer 104, for example an InGaP layer with a thickness of about 10-100 nm and n-type doping of $1e^{18}$-$1e^{19}$ cm$^{-3}$ can be provided. The purpose of the top transition layer is to allow for the initiation of quality III-V semiconductor growth on top of the group IV semiconductor layers below. This and subsequently described III-V layers can be grown in an MOCVD (Metal Oxide Chemical Vapor Deposition) system such as a Veeco TurboDisc As/P (Arsenide/Phosphide) MOCVD System, by methods well known in the art.

The GaAsP subcell 110 can include a back surface field layer which may have a lattice constant approximately matching the terminal composition of graded buffer 104, and thickness of between e.g. 50-200 nm, with n type doping levels of about $1e^{17}$-$1e^{19}$ cm$^{-3}$, or for example between $3e^{17}$-$3e^{18}$ cm$^{-3}$. This layer may be comprised of GaAsP, or of a wider-bandgap semiconductor layer such as InGaP. GaAsP subcell 110 can include a GaAsP base layer above the back surface field layer, which may have lattice constant approximately matching the terminal composition of graded buffer 104, and a thickness of between 0.2-2.0 um, with n type doping levels of about $1e^{16}$-$1e^{18}$ cm$^{-3}$, or for example about $1e^{17}$-$2e^{17}$ cm$^{-3}$. Alternately, the GaAsP base layer can be slightly tensile, with for example about 0.05-0.15% strain. A GaAsP emitter layer may be grown above the GaAsP base layer with p type doping of e.g. $1e^{17}$-$1e^{19}$ cm$^{-3}$, or about $1e^{18}$-$3e^{18}$ cm$^{-3}$, and with a lattice constant similar to the GaAsP base layer. The GaAsP emitter layer can have a thickness of about 50-200 nm, or about 100 nm. Additional layers can include a window layer of AlInP or InGaP, for example with a lattice constant similar to the underlying GaAsP base and emitter layers, and thickness of between 10-50 nm, with p type doping levels of for example about $2e^{17}$-$2e^{18}$ cm$^{-3}$. Alternately, the window layers may be somewhat tensile, with up to e.g. 2% tensile strain, allowing a wider bandgap for less ultraviolet absorption. A GaAsP or GaAs contact layer can also be provided with a lattice constant similar to the terminal portion of graded buffer 104, and a thickness of between 100-500 nm with p type doping levels of about $5e^{18}$-$1e^{20}$ cm$^{-3}$. The contact layer may be removed via wet etching after subsequent top contact grid formation, and thus only remain under the top contact grid in the final structure, an approach which is well known in the art of making III-V-based multi junction solar cells. An exemplary process of creating a GaAsP cell is known in the art. For example, see Vernon et al., "Development of high-efficiency GaAsP solar cells on compositionally graded buffer layers", page 108-112, IEEE Photovoltaic Specialists Conference, 19th, New Orleans, La., May 4-8, 1987, Proceedings.

Referring to FIG. 2g, top contacts 112 can be provided on the exposed surface of the GaAsP subcell 110. The top contacts 112 can be provided by known methods in the art.

For example, a grid structure of CrAu with a thickness of e.g. 1 um-5 um may be provided. A top contact grid can be applied by screen printing, inkjet printing, aerosol printing, or other methods known in the art. For example, this can be a layer e.g. of Ni, Ag, or a thin layer of Au. Optionally, this grid can be thickened by electroplating or light induced plating, with e.g. Ni and/or Cu.

An example of solar cell top grid metallization via a combination of printed metal ink followed by grid line thickening using light induced plating of copper, an exemplary process is described in greater detail in, for example, Mette A., Richter P. L., Hörteis M., and Glunz S. W. (2007), "Metal aerosol jet printing for solar cell metallization", Progress in Photovoltaics: Research and Applications, Vol 15, No. 7, pp. 621-627. In this case, an aerosol jet system was used to deposit the metal ink.

Referring to FIG. 2h, a wet etch is performed to remove the top layer of the GaAsP cell. The etch solution can be e.g. a 1:1:5 solution of NH4OH (ammonium hydroxide)+H2O2 (hydrogen peroxide)+H2O (water) at 75 or 80° C. This etch may stop selectively at the window layer, layer 12 in FIG. 11. This technique of using a wet etch to remove a III-V contact layer (except in areas protected by the top contact grid) and stopping on a III-V window layer is known in the art.

Referring to FIG. 2j, Anti-reflection coating (ARC) 120 of silicon nitride with a thickness of about 10-500 nm can also be provided to improve the solar cell efficiency. Methods and materials for providing top contacts and top ARC for III-V-based multi junction solar cells is well known in the art. The ARC 120 can also be a ZnS/MgF2 dual layer ARC, as is known in the art. This can be deposited by PECVD, sputtering, or evaporation, for example. Alternately, this can be a SiNx or SiOxNy single or dual-layer ARC. An example of using SiNx as part of dual-layer ARCs for III-V solar cells, is described in greater detail in, for example, "Anti-reflection Coating Design for Triple-Junction III-V/Ge High-Efficiency Solar Cells Using Low Absorption PECVD Silicon Nitride" by Homier, R.; Jaouad, A.; Turala, A.; Valdivia, C. E.; Masson, D.; Wallace, S. G.; Fafard, S.; Ares, R.; Aimez, V.; published in IEEE J. of Photovoltaics, Vol. 2 Issue 3, p 393-7 (2012).

Referring to FIG. 2k, bottom surface of the dielectric layer 114 may mirror or have similar texture of the first surface 102a of the substrate 102, to provide a pyramidally textured surface. Such a surface can cause light redirection upon reflection from the rear surface. Re-direction of the light away from a direction substantially normal to the top solar cell surface promotes total internal reflection. Add rear point contacts/reflector. FIG. 10 represents wafer after this process. Openings 116a can be provided over a small percentage of the rear dielectric area (e.g. 0.5-10%) to allow electrical contacts 118 between the bottom contact/reflector layer 118 and the Si substrate. These openings 116a can be formed by e.g. photolithography or laser ablation, by methods well known in the art. These openings 116a can be formed by e.g. photolithography or laser ablation [see e.g. "Selective Laser Ablation of Dielectric Layers", S. Correia et al., Proceedings of 22nd European Photovoltaic Solar Energy Conference, 3-7 Sep. 2007] or ink jet printing of dielectric etchants [see e.g. "Direct patterned etching of silicon dioxide and silicon nitride dielectric layers by ink jet printing", A. Lennon et al., *Solar Energy Materials & Solar Cells* 93 (2009) p 1865-1874]. Such openings 116a can be round and e.g. 1-100 microns in diameter. The bottom contact metal layer 114 can be provided by depositing metal, e.g. aluminum or silver with a thickness of about 0.5-2.0 microns, by PVD or by methods well known in the art. The deposition of top and bottom contacts can be followed by an annealing step at e.g. 300-500° C. to reduce resistance between the contacts and the semiconductor layers. In addition to providing rear electrical contact, this rear metal provides a reflective surface to promote internal reflection of any light which has passed through both the GaAsP top subcell and the bottom SiGe subcell, improving light collection in the solar cell. Because the silicon substrate has a much wider energy bandgap than the bottom SiGe subcell, any light that is unabsorbed after passing through the SiGe subcell will be well below the energy bandgap of silicon. Thus, the silicon substrate 102 can be nearly transparent for the wavelengths in question, allowing multiple light reflections between the top and bottom interior surfaces of the solar cell. The dielectric layer 114 provided between substrate 102 and bottom contact metal layer 114 can also enhance rear surface reflection.

Exemplary Method of Construction

Figure 3:
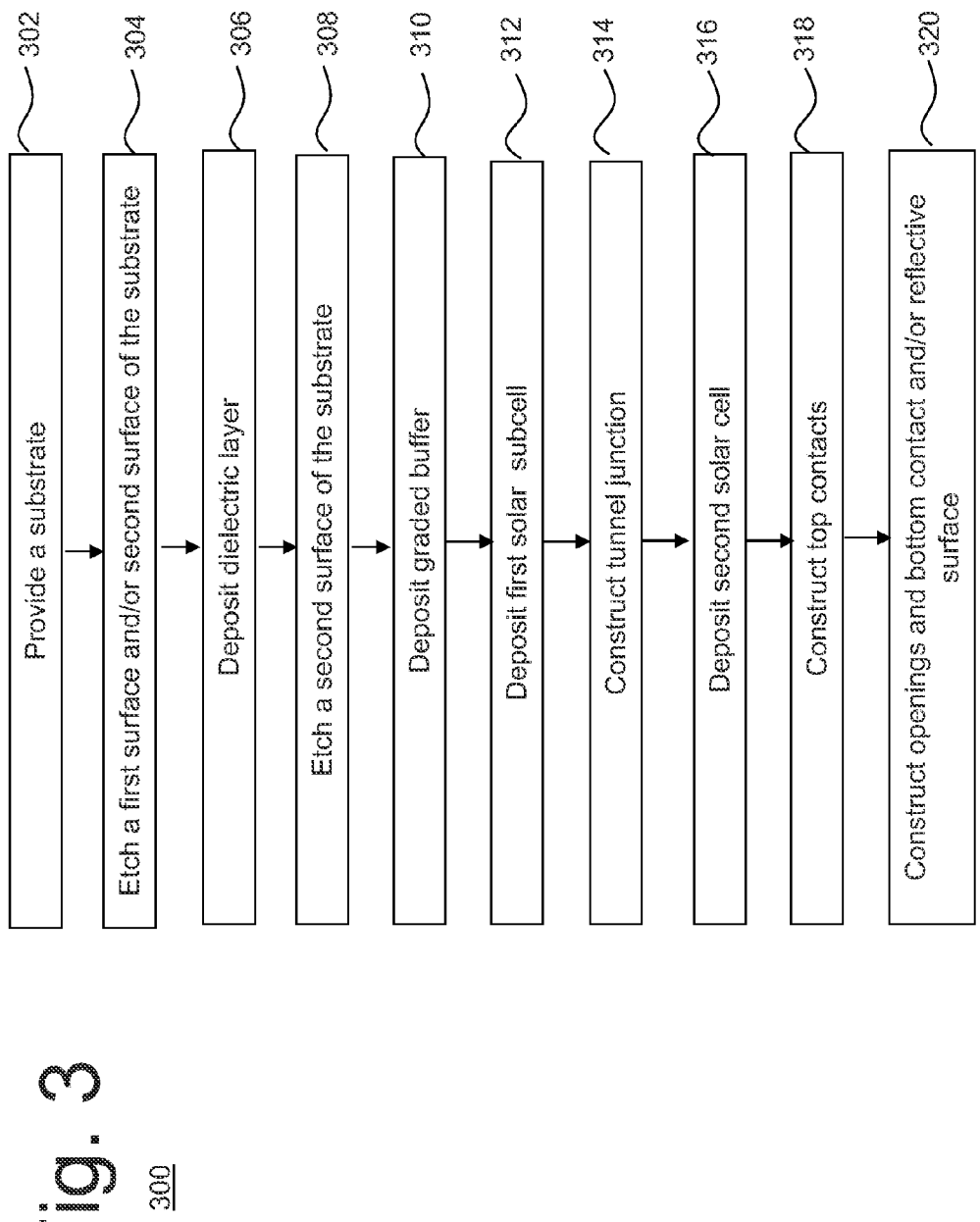
FIG. 3 is a flow chart of exemplary actions used to construct a device in accordance with the exemplary multi junction cell embodiment of the invention.

Referring to FIG. 3, an exemplary method of constructing a multi junction solar cell device 300 may include the following actions. A silicon substrate 102, as previously described, is provided (block 302). Etch a first surface 102a and/or a second surface 102b of the silicon substrate 102, as previously described (block 304). Deposit a dielectric layer 114 on the first surface 102a (block 306). Etch a second surface 102b of the silicon substrate 102, as previously described (block 308). Epitaxially grow a graded buffer layer 104 on top of the second surface 102b the substrate 102 (block 310). Epitaxially grow a first solar subcell 106 on top of the graded buffer layer 104 (block 312). Epitaxially grow a tunnel junction 108 above the first solar subcell (block 314). Epitaxially grow a second solar cell junction 110 on top of the tunnel junction transition layer 108 (block 316). Construct top contacts on a top surface of the second solar cell junction 110 (block 318). Construct openings 116a and bottom contact and/or reflective surface 116 on a bottom surface of the dielectric layer 114 (block 320). The exemplary method of construction may be modified to incorporate other embodiments, for example, but not limited to actions associated with rear surface passivation and contacting as described in previous embodiments.

Referring to FIG. 4, more detailed exemplary structures and methods of constructing a multi junction solar cell device are shown in FIG. 4.

Additional Alternative Embodiments

A) Layers 5-8 in FIG. 4 can be replaced by the layers in FIG. 5, to put tunnel junction in Ge.

B) Layers 5-8 in FIG. 4 can be replaced by the layers in FIG. 6, to put tunnel junction in SiGe C) Layers 6-8 in FIG. 4 can be replaced by the layers in FIG. 7, to form a hetero-tunnel-junction. The N-type Ge layer (layer 5 in FIG. 4) serves as N-side of TJ, in this case.

D) A III-V graded buffer can be grown via MOCVD (for example) between the top and bottom solar cell, to allow for higher top cell lattice constant and lower top cell Eg, which may lead to higher efficiency. This is illustrated in FIG. 8. FIG. 8 only shows the III-V epi layers; layers 1-5 can be as in FIG. 4.

E) An alternative way to lower the Eg of the top cell can be to add a small percentage of nitrogen to the GaAsP base layer during the epitaxial growth process. This amount can be on the order of 1% or less. This may produce GaAsNP, a so-called "dilute nitride"; methods to grow dilute nitrides are well known in the art. The addition of the nitrogen reduces the lattice constant compared to GaAsP, thus allowing a lower top cell bandgap at the same lattice constant as the SiGe bottom cell.

Elements of alternative embodiments A, B or C may be combined with alternative structures D or E.

Other modifications and substitutions by one of ordinary skill in the art are considered to be within the scope of the present invention, which is not to be limited except by the following claims.

The invention claimed is:

1. A method of making a multi junction solar cell comprising the actions of:
   providing a silicon substrate;
   etching a first surface of the silicon substrate;
   depositing a dielectric layer on the first surface of the silicon substrate;
   etching a second surface of the silicon substrate wherein the dielectric layer masks the first surface during the action of etching a second surface of the silicon substrate;
   depositing a silicon germanium graded buffer layer on the second surface of the substrate;
   depositing a first solar subcell base layer and a first solar subcell emitter layer within or on top of the graded buffer layer; and
   depositing a second solar subcell base layer and a second solar subcell emitter layer of GaAsP or other III-V material on top of the first solar subcell base layer and the first solar subcell emitter layer.

2. A method of making a multi junction solar cell of claim 1, wherein the action of etching a first surface of the silicon substrate further comprises etching said second surface of the silicon substrate with the same etchant in the same etching process.

3. A method of making a multi junction solar cell of claim 1, wherein the action of etching a first surface of the silicon substrate uses potassium hydroxide as an etchant.

4. A method of making a multi junction solar cell of claim 1, wherein the silicon substrate is a wafer sawn from a silicon ingot.

5. A method of making a multi junction solar cell of claim 1, wherein the silicon substrate is a wafer sawn from a silicon ingot and said wafer has saw damage and said method of making a multi junction solar cell does not include lapping or polishing said wafer.

6. A method of making a multi junction solar cell of claim 1, wherein the dielectric layer is Silicon Dioxide.

7. A method of making a multi junction solar cell of claim 1, wherein the dielectric layer is about 10-1000 nanometers thick.

8. A method of making a multi junction solar cell of claim 1, wherein a etched textured surface of the first surface provided by the action of etching the first surface is maintained through the dielectric layer.

9. A method of making a multi junction solar cell of claim 1, wherein the action of etching a first surface of the silicon substrate selectively stops at a silicon (111) crystalline surface.

10. A method of making a multi junction solar cell of claim 1, wherein the action of etching a first surface of the silicon substrate further comprises etching a second surface of the silicon and selectively stops at a silicon (111) crystalline surface on both said first surface and said second surface.

11. A method of making a multi junction solar cell of claim 1, further comprising the action of:
    forming openings through the dielectric layer on over about 0.5-10 percent of a surface area of the dielectric layer and
    depositing metal on a rear surface of the dielectric layer and within the openings wherein the metal provides a bottom electrical contact and a reflective layer.

* * * * *